US012696631B2

(12) United States Patent
Cho et al.

(10) Patent No.: US 12,696,631 B2
(45) Date of Patent: Jul. 28, 2026

(54) DISPLAY APPARATUS AND METHOD OF MANUFACTURING THE SAME

(71) Applicant: Samsung Display Co., LTD., Yongin-si (KR)

(72) Inventors: Dongyeon Cho, Yongin-si (KR); Kihyun Kim, Yongin-si (KR); Younggil Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 571 days.

(21) Appl. No.: 18/170,204

(22) Filed: Feb. 16, 2023

(65) Prior Publication Data

US 2023/0413617 A1 Dec. 21, 2023

(30) Foreign Application Priority Data

Jun. 17, 2022 (KR) ........................ 10-2022-0074332

(51) Int. Cl.
 *H10K 59/124* (2023.01)
 *H10K 59/12* (2023.01)
 *H10K 59/121* (2023.01)
 *H10K 59/131* (2023.01)

(52) U.S. Cl.
 CPC ....... *H10K 59/124* (2023.02); *H10K 59/1201* (2023.02); *H10K 59/1213* (2023.02); *H10K 59/1216* (2023.02); *H10K 59/131* (2023.02)

(58) Field of Classification Search
 CPC ............. H10K 59/124; H10K 59/1201; H10K 59/1213; H10K 59/1216; H10K 59/131; H10K 59/38; H10K 59/123; H10K 71/00; H10D 30/6755
 See application file for complete search history.

(56) References Cited

U.S. PATENT DOCUMENTS

| | | | | |
|---|---|---|---|---|
| 2016/0365522 | A1* | 12/2016 | Seo ...................... | H10K 77/111 |
| 2017/0047546 | A1* | 2/2017 | Choi ................. | H01L 21/02118 |
| 2021/0202910 | A1 | 7/2021 | Lee | |
| 2023/0013464 | A1* | 1/2023 | Hong ................. | H10K 59/1201 |
| 2023/0189591 | A1* | 6/2023 | Moon .................... | H10K 59/12 |
| | | | | 257/43 |
| 2023/0209896 | A1* | 6/2023 | Ryu ..................... | H10D 86/423 |
| | | | | 257/40 |

(Continued)

FOREIGN PATENT DOCUMENTS

| | | |
|---|---|---|
| CN | 113066804 A | 7/2021 |
| JP | 2019-186301 A | 10/2019 |

(Continued)

*Primary Examiner* — Douglas W Owens
(74) *Attorney, Agent, or Firm* — Womble Bond Dickinson (US) LLP

(57) ABSTRACT

A display apparatus includes a thin film transistor including a semiconductor pattern including an oxide semiconductor and a gate electrode overlapping the semiconductor pattern, a first interlayer insulating layer on the semiconductor pattern and the gate electrode, and a connection electrode on the first interlayer insulating layer and contacting the semiconductor pattern through a contact hole penetrating the first interlayer insulating layer, wherein the connection electrode entirely covers the gate electrode in a plan view, and an end portion of the gate electrode is spaced apart from the contact hole by a first distance.

18 Claims, 14 Drawing Sheets

(56) References Cited

U.S. PATENT DOCUMENTS

2024/0389383 A1 * 11/2024 Huang ................. H10K 59/126

FOREIGN PATENT DOCUMENTS

| KR | 2001-0075364 A | 8/2001 |
| KR | 10-2008-0053355 A | 6/2008 |
| KR | 10-2020-0143562 A | 12/2020 |
| KR | 10-2021-0084835 A | 7/2021 |
| KR | 10-2021-0117164 A | 9/2021 |
| KR | 10-2021-0118284 A | 9/2021 |

* cited by examiner

1100 : 1101, 1102, DL, ISL1, PL
1200 : 1201, 1202, 1203
1300 : 1301, 1302, GCL, SL
1400 : 1401, 1402, ISL2

1100 : 1101
1200 : 1201
1300 : 1301

1301

116
115
1201
111
100 t1

1101

A                                          A' z

113   T1   GE1   Act1

1100 : 1101
1200 : 1201
1300 : 1301

1100 : 1101
1200 : 1201
1300 : 1301
1400 : 1401

DISPLAY APPARATUS AND METHOD OF MANUFACTURING THE SAME

CROSS-REFERENCE TO RELATED APPLICATION

This application claims priority to and the benefit of Korean Patent Application No. 10-2022-0074332, filed on Jun. 17, 2022, in the Korean Intellectual Property Office, the entire content of which is hereby incorporated by reference.

BACKGROUND

1. Field

Embodiments of the present disclosure relate to a display apparatus and a method of manufacturing the same, and, for example, to a display apparatus in which high-quality images are displayed, and a method of manufacturing the display apparatus.

2. Description of the Related Art

In general, display apparatuses include organic light-emitting diodes as display elements. The organic light-emitting diodes each include a pixel electrode, an opposite electrode, and an emission layer therebetween. Each of the display apparatuses includes a thin film transistor, a capacitor, and/or lines to control electrical signals applied to the organic light-emitting diodes.

SUMMARY

However, in an existing display apparatus, external impurities may diffuse to a semiconductor layer of a thin film transistor, and thus, electrical characteristics of the thin film transistor are changed.

The subject matter of the present disclosure addresses various technical goals including the aforementioned ones and provides a display apparatus capable of displaying high-quality images by reducing the diffusion of external impurities to a semiconductor layer of a thin film transistor and a method of manufacturing the display apparatus. However, this is merely an example, and the scope of the present disclosure is not limited thereto.

Additional aspects of embodiments will be set forth in part in the description which follows and, in part, will be apparent from the description, or may be learned by practice of the presented embodiments of the disclosure.

According to one or more embodiments, a display apparatus includes a thin film transistor including a semiconductor pattern including an oxide semiconductor and a gate electrode overlapping the semiconductor pattern, a first interlayer insulating layer on the semiconductor pattern and the gate electrode, and a connection electrode on the first interlayer insulating layer and contacting the semiconductor pattern through a contact hole penetrating the first interlayer insulating layer, wherein the connection electrode entirely covers the gate electrode in a plan view, and an end portion of the gate electrode is spaced apart from the contact hole by a first distance.

The first distance may be equal to or greater than about 10 μm.

The display apparatus may further include a second interlayer insulating layer on the connection electrode, wherein a hydrogen concentration of the second interlayer insulating layer may be greater than a hydrogen concentration of the first interlayer insulating layer.

The hydrogen concentration of the second interlayer insulating layer may be equal to or greater than about $2.0 \times 10^{22}$ atoms/cm$^3$, and in an area where the gate electrode overlaps the semiconductor pattern, a hydrogen intensity in an interface of the semiconductor pattern may be less than or equal to about $1.0 \times 10^3$ counts/sec.

The first interlayer insulating layer may include silicon oxynitride (SiON), and the second interlayer insulating layer may include silicon nitride (SiN$_x$).

According to one or more embodiments, a display apparatus includes a thin film transistor including a semiconductor pattern including an oxide semiconductor and a gate electrode overlapping the semiconductor pattern, a first interlayer insulating layer on the semiconductor pattern and the gate electrode, a third interlayer insulating layer on the first interlayer insulating layer and having a higher density than the first interlayer insulating layer, and a connection electrode contacting the semiconductor pattern through a contact hole penetrating the first interlayer insulating layer and the third interlayer insulating layer, wherein the connection electrode entirely covers the gate electrode in a plan view.

The third interlayer insulating layer may include a SiN$_x$ layer of which a hydrogen intensity is between about $5.0 \times 10^{21}$ counts/sec and about $1.5 \times 10^{22}$ counts/sec.

The third interlayer insulating layer may include a SiN$_x$ layer of which hydrogen emissions are between about $1.0 \times 10^{15}$ molecules/cm$^2$ and about $5.0 \times 10^{16}$ molecules/cm$^2$.

The third interlayer insulating layer may include a SiO$_x$ layer of which a hydrogen intensity is between about $5.0 \times 10^{20}$ counts/sec and about $1.0 \times 10^{21}$ counts/sec.

The third interlayer insulating layer may include a SiO$_x$ layer of which hydrogen emissions are between about $5.0 \times 10^{14}$ molecules/cm$^2$ and about $1.0 \times 10^{15}$ molecules/cm$^2$.

A thickness of the third interlayer insulating layer may be between about 10 nm and about 40 nm.

According to one or more embodiments, a method of manufacturing a display apparatus includes forming, on a substrate, a lower metal layer and a buffer layer covering the lower metal layer, forming, on the buffer layer, a semiconductor pattern, a gate electrode, and a first interlayer insulating layer covering the gate electrode, forming a connection electrode on the first interlayer insulating layer, contacting the semiconductor pattern through a contact hole penetrating the first interlayer insulating layer, and entirely covering the gate electrode in a plan view, and forming a second interlayer insulating layer covering the connection electrode.

In the forming the connection electrode, the contact hole may be spaced apart from an end portion of the gate electrode by a first distance, and the first distance may be equal to or greater than about 10 μm.

A hydrogen concentration of the second interlayer insulating layer may be higher than a hydrogen concentration of the first interlayer insulating layer.

The first interlayer insulating layer may include SiON, and the second interlayer insulating layer may include silicon nitride SiN$_x$.

The method may further include forming a third interlayer insulating layer on the first interlayer insulating layer, the forming being performed between the forming of the first interlayer insulating layer and the forming of the connection electrode, wherein a hydrogen intensity of the third interlayer insulating layer is less than or equal to about $1.5 \times 10^{22}$ counts/sec and/or hydrogen emissions thereof are less than or equal to about $1.0 \times 10^{16}$ molecules/cm$^2$.

In the forming of the third interlayer insulating layer, the third interlayer insulating layer may include a SiN$_x$ layer and may be formed in a silane (SiH$_4$) gas and nitrogen (N$_2$) gas atmosphere.

In the forming of the third interlayer insulating layer, the third interlayer insulating layer may include a SiO$_x$ layer and is formed at a deposition power in a range from about 4 kW to about 8 kW.

A thickness of the third interlayer insulating layer may be between about 10 nm and about 40 nm.

A hydrogen concentration of the second interlayer insulating layer may be equal to or greater than about $2.0 \times 10^{22}$ atoms/cm$^3$, and in an area where the gate electrode overlaps the semiconductor pattern, a hydrogen intensity in an interface of the semiconductor pattern may be less than or equal to about $1.0 \times 10^3$ counts/sec.

Other aspects and features of embodiments, other than those described above will become apparent from the following detailed description, claims and drawings for carrying out the disclosure.

BRIEF DESCRIPTION OF THE DRAWINGS

The above and other aspects and features of certain embodiments of the present disclosure will be more apparent from the following description taken in conjunction with the accompanying drawings, in which.

DETAILED DESCRIPTION

Figure 1:
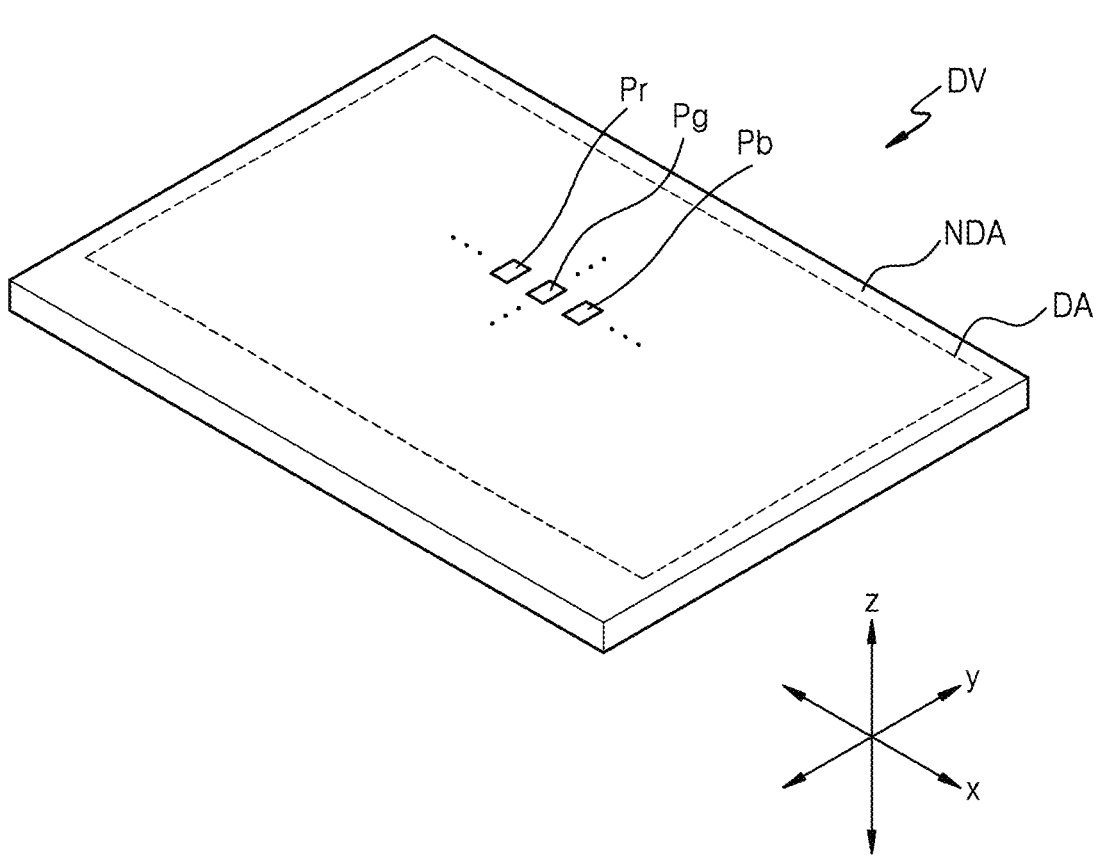
FIG. 1 is a schematic perspective view of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, example embodiments will be illustrated in the drawings and described in more detail in the written description. The attached drawings for illustrating example embodiments of the present disclosure are referred to in order to gain a sufficient understanding of the subject matter of the present disclosure, the merits thereof, and the objectives accomplished by the implementation of the subject matter of the present disclosure. The subject matter of the disclosure may, however, be embodied in many different forms and should not be construed as being limited to the embodiments set forth herein.

Hereinafter, one or more embodiments of the disclosure will be described in more detail with reference to the accompanying drawings. Like elements in the drawings denote like elements, and duplicative descriptions thereof are not repeated.

It will be understood that although the terms "first," "second," etc. may be used herein to describe various elements, these elements should not be limited by these terms, and these elements are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present.

It will be understood that when a layer, region, or component is referred to as being connected to another layer, region, or component, it can be directly or indirectly connected to the other layer, region, or component. For example, when a layer, region, or component is referred to as being electrically connected to another layer, region, or component, it can be directly or indirectly electrically connected to the other layer, region, or component.

In the present embodiment, an expression such as "A and/or B" indicates A, B, or A and B. Also, an expression such as "at least one of A and B" indicates A, B, or A and B.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a set or specific process order may be performed differently from the described order. For example, two consecutively described processes may be performed substantially at the same time or performed in an order opposite to the described order.

Sizes of elements in the drawings may be exaggerated for convenience of explanation. In other words, because sizes and thicknesses of elements in the drawings may be arbitrarily illustrated for convenience of explanation, the following embodiments are not limited thereto.

FIG. 1 is a schematic perspective view of a display apparatus according to an embodiment.

Referring to FIG. 1, a display apparatus DV may include a display area DA and a non-display area NDA outside the display area DA.

The display apparatus DV may provide an image through an array of sub-pixels that are two-dimensionally arranged on a plane in the display area DA. The sub-pixels may include a red sub-pixel Pr, a green sub-pixel Pg, and a blue sub-pixel Pb. The red sub-pixel Pr, the green sub-pixel Pg, and the blue sub-pixel Pb may be areas where red light, green light, and blue light may be emitted, respectively, and the display apparatus DV may provide an image by using light emitted from the sub-pixels.

The non-display area NDA may be an area where no images are displayed (e.g., an area that is not designed to emit light to display an image) and may entirely surround the display area DA. In the non-display area NDA, drivers or voltage lines configured to provide electrical signals or power to sub-pixel circuits may be arranged. In the non-display area NDA, a pad that may be electrically connected to an electronic component or a printed circuit board may be included.

The display area DA may have a polygonal shape. For example, the display area DA may have a rectangular shape in which a horizontal length is greater than a vertical length, as shown in FIG. 1. In some embodiments, the display area DA may have a rectangular shape, in which a horizontal length is less than a vertical length, or a square shape. In some embodiments, the display area DA may have various suitable shapes such as an oval shape or a circular shape.

Figure 2:
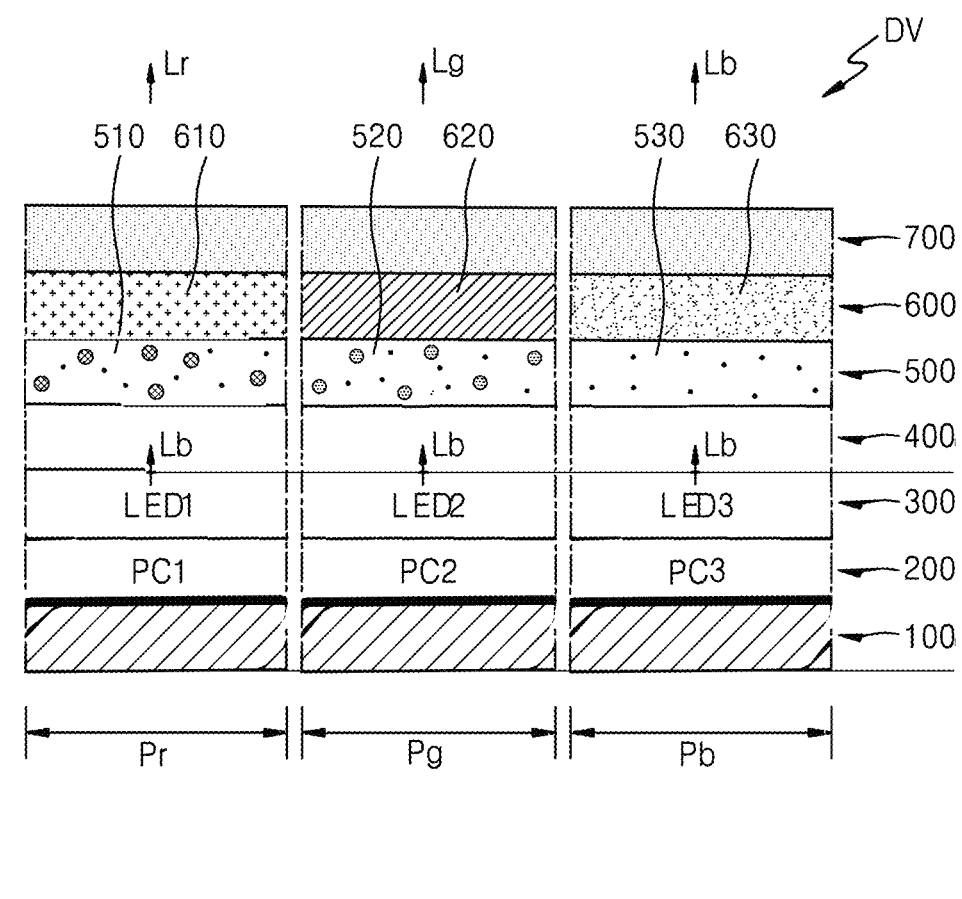
FIG. 2 is a schematic cross-sectional view of each of sub-pixels of a display apparatus, according to an embodiment.

FIG. 2 is a schematic cross-sectional view of each sub-pixel of a display apparatus, according to an embodiment.

Referring to FIG. 2, the display apparatus DV may include a circuit layer 200 on a substrate 100. The circuit layer 200 may include a first sub-pixel circuit PC1, a second sub-pixel circuit PC2, and a third sub-pixel circuit PC3, and the first sub-pixel circuit PC1 to the third sub-pixel circuit PC3 may be electrically connected to a first light-emitting diode LED1, a second light-emitting diode LED2, and a third light-emitting diode LED3, respectively, of a light-emitting diode layer 300.

The first light-emitting diode LED1 to the third light-emitting diode LED3 may respectively include organic light-emitting diodes including organic materials. In some embodiments, the first light-emitting diode LED1 to the third light-emitting diode LED3 may respectively include inorganic light-emitting diodes including inorganic materials. The inorganic light-emitting diode may include a PN junction diode including materials based on an inorganic semiconductor. When a voltage is applied to the PN junction diode in a forward direction, electrons and holes may be injected, and energy generated from the recombination of the electrons and holes may be converted into light energy so that certain colors of light may be emitted. The inorganic light-emitting diode described above may have a width of several to several hundreds of micrometers or several to several hundreds of nanometers. In some embodiments, the first light-emitting diode LED1 to the third light-emitting diode LED3 may respectively be light-emitting diodes including quantum dots. As described above, emission layers of the first light-emitting diode LED1 to the third light-emitting diode LED3 may include organic materials, inorganic materials, quantum dots, both organic materials and quantum dots, and/or both inorganic materials and quantum dots.

The first light-emitting diode LED1 to the third light-emitting diode LED3 may emit light having the same color. For example, the first light-emitting diode LED1 to the third light-emitting diode LED3 may emit light (e.g., blue light Lb) in a wavelength included in a first wavelength band. The first wavelength band may range from about 450 nm to about 495 nm. For example, the light (e.g., the blue light Lb) emitted from the first light-emitting diode LED1 to the third light-emitting diode LED3 may pass through a color conversion-penetration layer 500 via an encapsulation layer 400 on the light-emitting diode layer 300.

The color conversion-penetration layer 500 may include optical units that transmit the light (e.g., the blue light Lb) emitted from the light-emitting diode layer 300 with or without converting the color of the emitted light. For example, the color conversion-penetration layer 500 may include color converters configured to convert the light (e.g., the blue light Lb) emitted from the light-emitting diode layer 300 into light of another color, and a penetration unit configured to transmit the light (e.g., the blue light Lb) emitted from the light-emitting diode layer 300 without converting the color of the emitted light. The color conversion-penetration layer 500 may include a first color converter 510 corresponding to the red sub-pixel Pr, a second color converter 520 corresponding to the green sub-pixel Pg, and a penetration unit 530 corresponding to the blue sub-pixel Pb. The first color converter 510 may convert the light (e.g., the blue light Lb) in the wavelength included in the first wavelength band into light (e.g., red light Lr) in a wavelength included in a second wavelength band. The second wavelength band may range from about 630 nm to about 780 nm. The second color converter 520 may convert the light (e.g., the blue light Lb) in the wavelength included in the first wavelength band into light (e.g., green light Lg) in a wavelength included in a third wavelength band. The third wavelength band may range from about 495 nm to about 570 nm. The penetration unit 530 may transmit the light (e.g., the blue light Lb) in the wavelength included in the first wavelength band without (e.g., substantially without) converting the light. However, one or more embodiments are not limited thereto, and modifications may be made to the wavelength band of the light (e.g., the blue light Lb), which is converted by the color conversion-penetration layer 500 and emitted from the light-emitting diode layer 300, and a wavelength band of a wavelength after the conversion.

A color layer 600 may be on the color conversion-penetration layer 500. The color layer 600 may include a first color filter 610, a second color filter 620, and a third color filter 630 of different colors. For example, the first color filter 610 may be a red color filter that only (e.g., substantially only) transmits light in a wavelength in a range from about 630 nm to about 780 nm. The second color filter 620 may be a green color filter that only (e.g., substantially only) transmits light in a wavelength in a range from about 495 nm to about 570 nm. The third color filter 630 may be a blue color filter that only (e.g., substantially only) transmits light in a wavelength in a range from about 450 nm to about 495 nm.

In an embodiment, black matrixes may be between the first color filter 610, the second color filter 620, and the third color filter 630, according to necessity. In some embodiments, the first color filter 610 may have an opening corresponding to the green sub-pixel Pg and the blue sub-pixel Pb, the second color filter 620 may have an opening corresponding to the red sub-pixel Pr and the blue sub-pixel Pb, and the third color filter 630 may have an opening corresponding to the red sub-pixel Pr and the green sub-pixel Pg. In regions except for the openings respectively corresponding to the red sub-pixel Pr, the green sub-pixel Pg, and the blue sub-pixel Pb, portions in which the first color filter 610 to the third color filter 630 overlap may function as black matrixes.

The light, the color of which is converted and transmitted by the color conversion-penetration layer 500, may pass through the first color filter 610 to the third color filter 630 and may have improved color purity. Also, the color layer 600 may prevent or reduce reflection of external light (e.g., light that is incident towards the display apparatus DV from the outside thereof) and may prevent or reduce viewing of the external light by users.

A light-transmissive substrate layer 700 may be on the color layer 600. The light-transmissive substrate layer 700 may include glass and/or a light-transmissive organic material. For example, the light-transmissive substrate layer 700 may include a light-transmissive organic material, such as an acryl-based resin.

In an embodiment, the light-transmissive substrate layer 700 is sort of a substrate, and after the color layer 600 and the color conversion-penetration layer 500 are formed on the light-transmissive substrate layer 700, the color conversion-penetration layer 500 may be integrated with the encapsulation layer 400 to face the encapsulation layer 400.

In some embodiments, after the color conversion-penetration layer 500 and the color layer 600 are sequentially formed on the encapsulation layer 400, the light-transmissive substrate layer 700 may be formed on the color layer 600 through the direct spreading and hardening of the light-transmissive substrate layer 700. In some embodiments, other optical films, such as an anti-reflection (AR) film, may be arranged on the light-transmissive substrate layer 700.

The display apparatus DV having the above structure may include an electronic device, for example, a television, a billboard, a projection screen, a monitor, a tablet personal computer (PC), or a laptop, which may display moving or still images.

Figure 3:
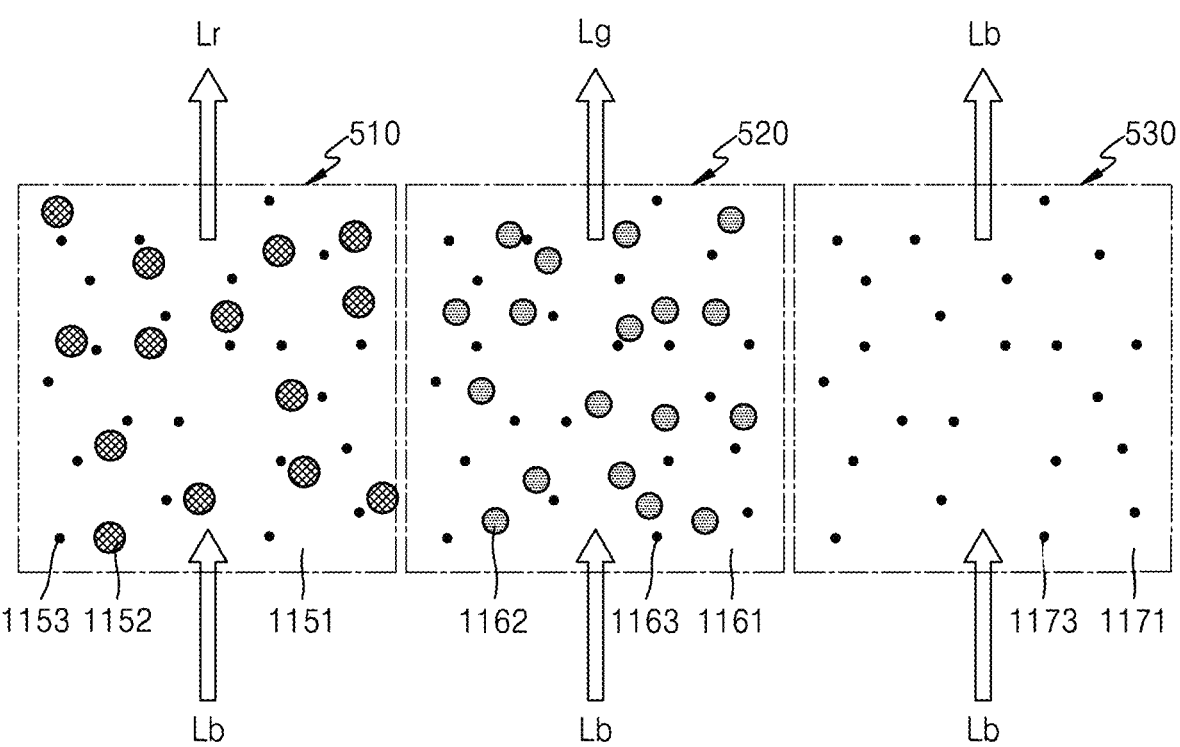
FIG. 3 is a schematic cross-sectional view showing each optical unit of a color conversion-penetration layer of FIG. 2.

FIG. 3 shows each optical unit of a color conversion-penetration layer of FIG. 2.

The first color converter 510 may convert the incident blue light Lb into the red light Lr. As shown in FIG. 3, the first color converter 510 may include a first photosensitive polymer 1151 and first quantum dots 1152 and first scattered particles 1153 that are spread on the first photosensitive polymer 1151 (e.g., dispersed in the first photosensitive polymer 1151).

The first quantum dots 1152 may be excited by the blue light Lb and isotropically emit the red light Lr having a greater wavelength than blue light. The first photosensitive polymer 1151 may include an organic material that is light-transmissive.

Quantum dots may denote crystals of a semiconductor compound and include any suitable materials capable of emitting light in various suitable wavelengths according to sizes of the crystals. Diameters of such quantum dots may each be between about 1 nm and about 10 nm.

The quantum dots may be synthesized according to a wet chemical process, a Metal Organic Chemical Vapor Deposition (MOCVD) process, a Molecular Beam Epitaxy (MBE) process, and/or the like. The wet chemical process is a method whereby an organic solvent is mixed together with a precursor material and then quantum-dot particle crystals grow. In the case of the wet chemical process, when crystals grow, the organic solvent naturally functions as a dispersant coordinated on a quantum-dot crystal surface and adjusts the growth of the crystals. It may be easier to perform the wet chemical process than a vapor deposition method such as MOCVD or MBE. In addition, the wet chemical process is a low-cost process and may be used to control the growth of quantum dot particles.

The quantum dots may include Group III-VI semiconductor compounds, Group II-VI semiconductor compounds, Group III-V semiconductor compounds, Group I-III-VI semiconductor compounds, Group IV-VI semiconductor compounds, Group IV elements or compounds, or any combination thereof.

Examples of the Group III-VI semiconductor compounds may include a binary compound, such as GaS, GaSe, $Ga_2Se_3$, GaTe, InS, InSe, $In_2Se_3$ and/or InTe, a three-element compound such as $InGaS_3$ and/or $InGaSe_3$, or any combination thereof.

Examples of the Group II-VI semiconductor compounds may include a binary compound, such as CdS, CdSe, CdTe, ZnS, ZnSe, ZnTe, ZnO, HgS, HgSe, HgTe, MgSe, and/or MgS, a three-element compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS, a quaternary compound such as CdZnSeS, CdZnSeTe, CdZnSTe, CdHgSeS, CdHgSeTe, CdHgSTe, HgZnSeS, HgZnSeTe, and/or HgZnSTe, or any combination thereof.

Examples of the Group III-V semiconductor compounds may include a binary compound, such as GaN, GaP, GaAs, GaSb, AlN, AlP, AlAs, AlSb, InN, InP, InAs, and/or InSb, a three-element compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or GaAlNP, a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb, or any combination thereof. The Group III-V semiconductor compounds may further include Group II elements. Examples of the Group III-V semiconductor compounds further including the Group II elements may include InZnP, InGaZnP, and/or InAlZnP.

Examples of the Group I-III-VI semiconductor compounds may include a three-element compound, such as AgInS, $AgInS_2$, CuInS, $CuInS_2$, $CuGaO_2$, $AgGaO_2$, and/or $AgAlO_2$, or any combination thereof.

Examples of the Group IV-VI semiconductor compounds may include a binary compound, such as SnS, SnSe, SnTe, PbS, PbSe, and/or PbTe, a three-element compound, such as SnSeS, SnSeTe, SnSTe, PbSeS, PbSeTe, PbSTe, SnPbS, SnPbSe, and/or SnPbTe, a quaternary compound, such as SnPbSSe, SnPbSeTe, and/or SnPbSTe, or any combination thereof.

The Group IV elements or compounds may include a single-element, such as Si or Ge, a binary compound, such as SiC and/or SiGe, or any combination thereof.

Respective elements included in multi-element compounds, such as a binary compound, a three-element compound, and a quaternary compound, may be in particles in a uniform concentration or irregular (e.g., non-uniform) concentrations.

A quantum dot may have a single structure in which a concentration of each element included in the quantum dot is uniform or a double structure including a core and a shell. For example, a material in the core may be different from that in the shell. The shell of the quantum dot may function as a protection layer for maintaining semiconductor characteristics by preventing or reducing a chemical modification of the core and/or a charging layer for providing electrophoresis characteristics to the quantum dot. The shell may be a layer or layers. An interface of the core and the shell may have a concentration gradient in which a concentration of elements in the shell decreases along a direction to the center of the quantum dot.

Examples of the shell of the quantum dot may include metal oxide, non-metal oxide, a semiconductor compound, or a combination thereof. Examples of metal and/or non-metal oxide may include a binary compound, such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$, and/or a three-element compound including $MgAl_2O_4$, $CoFe_2O_4$, $NiFe_2O_4$, $CoMn_2O_4$, and/or the like, but one or more embodiments are not limited thereto. As described above, examples of the semiconductor compounds may include Group III-VI semiconductor compounds, Group II-VI semiconductor compounds, Group III-V Group semiconductor compounds, Group semiconductor compounds, Group IV-VI semiconductor compounds, or any combination thereof. For example, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width at half maximum (FWHM) of the emission wavelength spectrum of less than or equal to about 45 nm, for example, less than or equal to about 40 nm, or, for example, less than or equal to about 30 nm, and the color purity and color reproducibility may be improved within the above range. Also, light emitted from the quantum dot may be discharged in all (e.g., substantially all) directions, and thus, a viewing angle of the light may be improved.

Also, a shape of the quantum dot may be a circle, a pyramid, a multi-arm, a cubic nanoparticle, a nanotube, a nanowire, a nanofiber, a plate-shaped nanoparticle, and/or the like.

Because an energy band gap may be adjusted by adjusting a size of a quantum dot, light in various suitable wavelength bands may be obtained from a quantum dot emission layer. Therefore, as quantum dots having different sizes are used, light-emitting diodes emitting light in different wavelengths may be realized. In more detail, the size of the quantum dot may be selected such that red light, green light, and/or blue light may be emitted. Also, the size of the quantum dot may be designed to emit white light by combining various suitable colors of light.

The first scattered particles 1153 may increase the color conversion efficiency by scattering the blue light Lb, which has not yet been absorbed into the first quantum dots 1152, to make more first quantum dots 1152 be excited (e.g., to increase the number of quantum dots 1152 that absorb and convert the blue light Lb). The first scattered particles 1153 may be, for example, metal oxide particles and/or organic particles. Metal oxide for the scattered particles may be titanium oxide ($TiO_2$), zirconium oxide ($ZrO_2$), aluminum oxide ($Al_2O_3$), indium oxide ($In_2O_3$), zinc oxide ($ZnO$), and/or tin oxide ($SnO_2$), and organic materials for the scattered particles may be acryl-based resin and/or urethane-based resin. A scattered particle, as described herein, may scatter light in various suitable directions regardless of an incident angle without changing a wavelength of light substantially. Thus, the scattered particles may improve the side visibility of a display apparatus.

The second color converter 520 may convert the incident blue light Lb into the green light Lg. As shown in FIG. 3, the second color converter 520 may include a second photosensitive polymer 1161, second quantum dots 1162 and second scattered particles 1163 that are spread on the second photosensitive polymer 1161 (e.g., dispersed in the second photosensitive polymer 1161).

The second quantum dots 1162 may be excited by the blue light Lb and isotropically emit the green light Lg having a greater wavelength than blue light. The second photosensitive polymer 1161 may include an organic material that is light-transmissive.

The second scattered particles 1163 may increase the color conversion efficiency by scattering the blue light Lb, which has not yet been absorbed into the second quantum dots 1162, to make more second quantum dots 1162 be excited (e.g., to increase the number of quantum dots 1162 that absorb and convert the blue light Lb). Because the descriptions regarding the first quantum dots 1152 and the first scattered particles 1153 may be applied to the second quantum dots 1162 and the second scattered particles 1163, descriptions regarding the second quantum dots 1162 and the second scattered particles 1163 are not repeated here.

In some embodiments, the first quantum dots 1152 may be the same materials as the second quantum dots 1162. In this case, sizes of the first quantum dots 1152 may be greater than those of the second quantum dots 1162.

The penetration unit 530 may transmit the blue light Lb without converting the blue light Lb incident on the transmission unit 530. Therefore, the penetration unit 530 does not include quantum dots. As shown in FIG. 3, the penetration unit 530 may include a third photosensitive polymer 1171 on which third scattered particles 1173 are spread (e.g., in which the third scattered particles 1173 are dispersed). The third photosensitive polymer 1171 may include an organic material, for example, silicon resin and/or epoxy resin, which is light-transmissive and may be the same material as the first and second photosensitive polymers 1151 and 1161. The third scattered particles 1173 may scatter and reflect the blue light Lb and include the same material as the first and second scattered particles 1153 and 1163.

Figure 4:
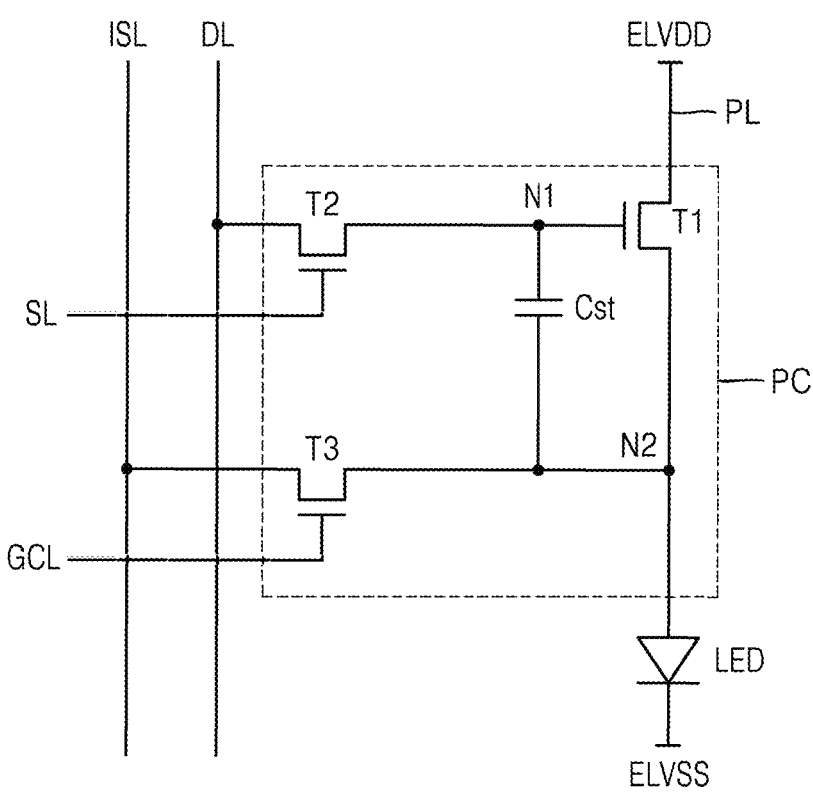
FIG. 4 is an equivalent circuit diagram of a light-emitting diode and a sub-pixel circuit electrically connected to the light-emitting diode which are included in a display apparatus, according to an embodiment.

FIG. 4 is an equivalent circuit diagram of a light-emitting diode and a sub-pixel circuit electrically connected to the light-emitting diode which are included in a display apparatus, according to an embodiment. The sub-pixel circuit PC of FIG. 4 corresponds to each of the first to third sub-pixel circuits PC1 to PC3 described above with reference to FIG. 2, and the light-emitting diodes LED of FIG. 4 may respectively correspond to the first to third light-emitting diodes LED1 to LED3 described above with reference to FIG. 2.

Referring to FIG. 4, a first electrode (e.g., a pixel electrode) of the light-emitting diode LED may be connected to the sub-pixel circuit PC, and a second electrode (e.g., an opposite electrode) of the light-emitting diode LED may be electrically connected to a common voltage line described below with reference to FIG. 5 and thus may receive a common voltage EVLSS. The light-emitting diode LED may emit light at a brightness corresponding to the amount of current provided from the sub-pixel circuit PC.

The sub-pixel circuit PC may control the amount of current flowing in the light-emitting diode LED in response to a data signal. The sub-pixel circuit PC may include a first transistor T1, a second transistor T2, a third transistor T3, and a storage capacitor Cst.

Each of the first transistor T1, the second transistor T2, and the third transistor T3 may be an oxide semiconductor transistor that includes a semiconductor layer including an oxide semiconductor. Because the oxide semiconductor has high carrier mobility and a low leakage current, a voltage drop may not be great despite a long operation time. For example, because a color change in images according to the voltage drop is not noticeable even during a low-frequency operation, the display apparatus may operate at a low frequency. According to types or kinds of transistors, a first electrode may be one of a source electrode and a drain electrode, and a second electrode may be the other thereof.

A first electrode of the first transistor T1 may be connected to a driving power line PL configured to provide the driving voltage ELVDD, and a second electrode of the first transistor T1 may be connected to the first electrode of the light-emitting diode LED. A gate electrode of the first transistor T1 may be connected to a first node N1. The first transistor T1 may be configured to control the amount of current flowing in the light-emitting diode LED from the driving voltage ELVDD, according to a voltage of the first node N1.

The second transistor T2 may be a switching transistor. A first electrode of the second transistor T2 may be connected to a data line DL, and a second electrode of the second transistor T2 may be connected to the first node N1. A gate electrode of the second transistor T2 may be connected to a scan line SL. The second transistor T2 may be turned on when a scan signal is provided to the scan line SL and may electrically connect the data line DL to the first node N1.

The third transistor T3 may be an initialization transistor and/or a sensing transistor. A first electrode of the third transistor T3 may be connected to a second node N2, and a second electrode of the third transistor T3 may be connected to a sensing line ISL. A gate electrode of the third transistor T3 may be connected to a control line GCL.

The storage capacitor Cst may be connected between the first node N1 and the second node N2. For example, a first capacitor electrode of the storage capacitor Cst may be connected to the gate electrode of the first transistor T1, and a second capacitor electrode of the storage capacitor Cst may be connected to the first electrode of the light-emitting diode LED.

FIG. 4 shows that the first transistor T1 to the third transistor T3 each are an NMOS transistor, but one or more embodiments are not limited thereto. For example, at least one of the first transistor T1 to the third transistor T3 may be a PMOS transistor.

FIG. 4 shows three transistors, but one or more embodiments are not limited thereto. The sub-pixel circuit PC may include four or more transistors.

Figure 5:
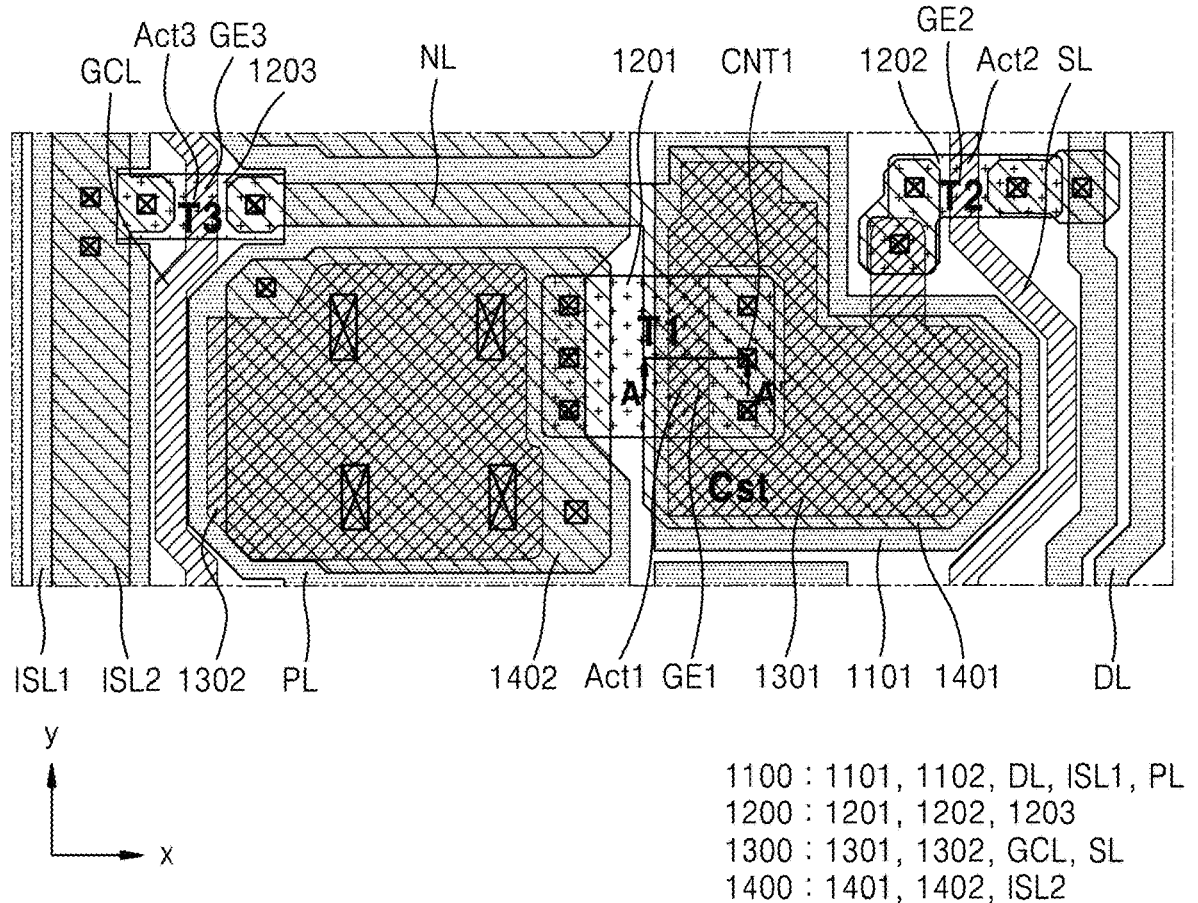
FIG. 5 is a schematic plan view of a display apparatus according to an embodiment.
Figure 6:
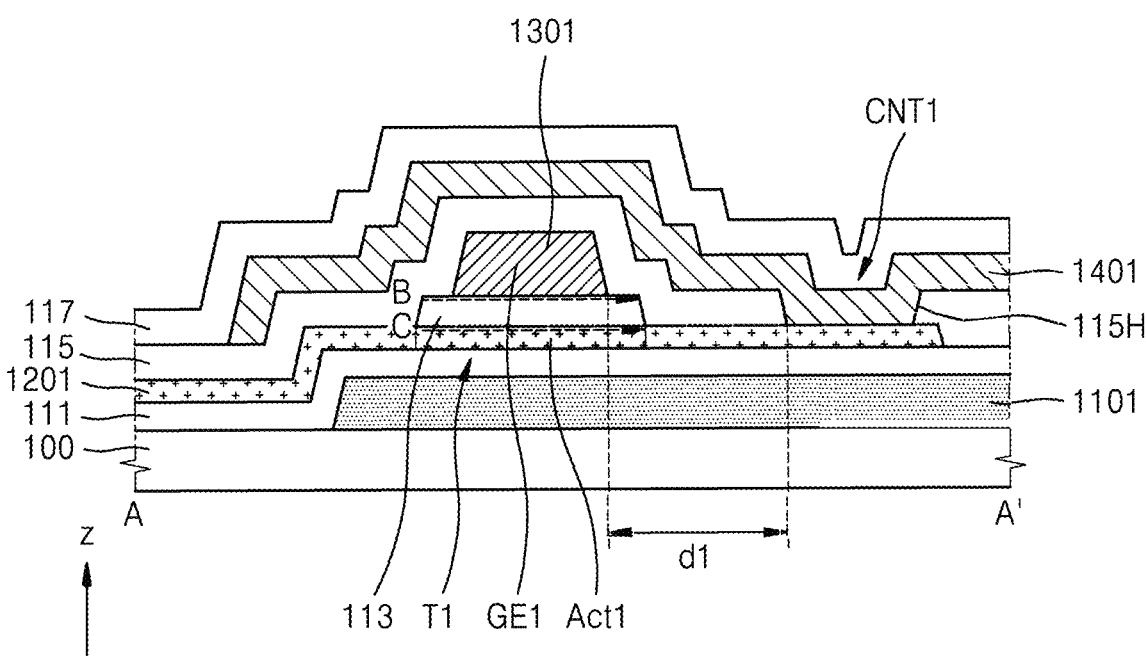
FIG. 6 is a schematic cross-sectional view of a display apparatus according to an embodiment.

FIG. 5 is a schematic plan view of a display apparatus according to an embodiment, and FIG. 6 is a schematic cross-sectional view of a display apparatus according to an embodiment. FIG. 6 may be a cross-sectional view showing a portion of the display apparatus corresponding to a cross-section of the display apparatus of FIG. 5 taken along line A-A', for example, a cross-sectional view showing the first transistor T1 and a structure around the same.

Referring to FIGS. 5 and 6, the substrate 100 may include glass, metal, and/or polymer resin. The polymer resin may include, for example, polyethersulphone, polyacrylate, polyetherimide, polyethylene naphthalate, polyethylene terephthalate, polyphenylene sulfide, polyarylate, polyimide, polycarbonate, cellulose acetate propionate, or a mixture thereof. Various suitable modifications may be made to the substrate 100. For example, the substrate 100 may have a multilayered structure that includes two layers including the above polymer resin and a barrier layer arranged therebetween and including an inorganic material (e.g., silicon oxide ($SiO_x$), silicon nitride ($SiN_x$), silicon oxynitride (SiON), and/or the like).

A buffer layer 111 including $SiO_x$, $SiN_x$, and/or SiON may be on the substrate 100. The buffer layer 111 may prevent or reduce diffusion of metal atoms, impurities, and/or the like from the substrate 100 towards a semiconductor layer 1200 arranged over the buffer layer 111.

A lower metal layer 1100 may be arranged between the substrate 100 and the buffer layer 111. The lower metal layer 1100 may include a first sensing line ISL1, the driving power line PL, and the data line DL, which extend in a first direction (e.g., a y direction), and a first capacitor electrode 1101 having an island shape.

The lower metal layer 1100 may include a metal, an alloy, conductive metal oxide, a transparent conductive material, and/or the like. For example, the lower metal layer 1100 may include silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and/or the like. The lower metal layer 1100 may include a multilayered structure, for example, a two-layer structure including Ti/Cu, and the layer structure and materials included therein may vary.

The semiconductor layer 1200 may be on the buffer layer 111. As described above, the semiconductor layer 1200 may include an oxide-based semiconductor material. For example, the semiconductor layer 1200 may include a Zn oxide-based material such as Zn oxide, In—Zn oxide, and/or Ga—In—Zn oxide. In some embodiments, the semiconductor layer 1200 may include indium (In)-gallium (Ga)—Zn—O (IGZO), In—Sn—Zn—O (ITZO), and/or In—Ga—Sn—Zn—O (IGTZO), in which zinc oxide ($ZnO_x$: ZnO and/or $ZnO_2$) is mixed together with a metal, such as In, Ga, and/or tin (Sn).

The semiconductor layer 1200 may include a first semiconductor pattern 1201, a second semiconductor pattern 1202, and a third semiconductor pattern 1203 each having an island shape. As shown in FIG. 5, the first transistor T1 may correspond to the first semiconductor pattern 1201, the second transistor T2 may correspond to the second semiconductor pattern 1202, and the third transistor T3 may correspond to the third semiconductor pattern 1203. The first semiconductor pattern 1201 may include a channel area Act1 overlapping a gate electrode GE1 of the first transistor T1 and conducting areas arranged on both sides of the channel area Act1 and doped with impurities and/or otherwise made to be conductive (e.g., electrically conductive). Any one of the conducting areas may correspond to a source area, and the other thereof may correspond to a drain area. As described, the second semiconductor pattern 1202 may include a channel area Act2 overlapping a gate electrode GE2 of the second transistor T2 and a conducting area, and the third semiconductor pattern 1203 may include a channel area Act3 overlapping a gate electrode GE3 of the third transistor T3 and a conducting area.

A gate insulating layer 113 may be on the semiconductor layer 1200. The gate insulating layer 113 may be patterned to have the same shape as a gate layer 1300 on the gate insulating layer 113. For example, in a plan view, the gate insulating layer 113 may be identically or similarly overlap the gate layer 1300. Except for the channel areas Act1 to Act3 overlapping the gate insulating layer 113, the source area, the drain area, and the like of the semiconductor layer 1200 may directly contact (e.g., physically contact) a first interlayer insulating layer 115, as shown in FIG. 6. The gate insulating layer 113 may include an insulating material. The gate insulating layer 113 may include an inorganic insulating layer including, for example, $SiO_x$, $SiN_x$, SiON, and/or aluminum oxide ($Al_2O_3$).

The gate layer 1300 may be on the gate insulating layer 113. The gate insulating layer 113 may include a first gate pattern 1301 and a second gate pattern 1302, each of which has an island shape, and a control line GCL and a scan line SL extending in the first direction (e.g., the y direction).

The first gate pattern 1301 may overlap portions of the first capacitor electrode 1101 and the first semiconductor pattern 1201. The first gate pattern 1301 may have an opening exposing an end portion of the first semiconductor pattern 1201, and the first semiconductor pattern 1201 may contact (e.g., physically contact) a first connection electrode 1401 through the opening.

A portion of the first gate pattern 1301, which overlaps the first semiconductor pattern 1201, may be defined as the gate electrode GE1 of the first transistor Ti. As described above, the gate electrode GE1 of the first transistor T1 may be formed by concurrently (e.g., simultaneously) patterning the gate electrode GE1 and the gate insulating layer 113 thereunder to make them have the same shape. A portion of the first semiconductor pattern 1201, which overlaps the gate electrode GE1 of the first transistor T1, may be the channel area Act1 of the first transistor T1. In the first semiconductor pattern 1201, one end and the other end of the channel area Act1 may be a first terminal and a second terminal of the first transistor T1, respectively.

The first gate pattern 1301 may form the first capacitor electrode 1101 of the lower metal layer 1100 and the storage capacitor Cst. For example, the first gate pattern 1301 may function as an upper capacitor electrode of the storage capacitor Cst.

The scan line SL may overlap a portion of the second semiconductor pattern 1202. A portion of the scan line SL, which overlaps the second semiconductor pattern 1202, may be defined as the gate electrode GE2 of the second transistor T2. A portion of the second semiconductor pattern 1202, which overlaps the gate electrode GE2 of the second transistor T2, may be the channel area Act2 of the second transistor T2.

The control line GCL may overlap a portion of the third semiconductor pattern 1203. A portion of the control line GCL, which overlaps the third semiconductor pattern 1203, may be defined as the gate electrode GE3 of the third transistor T3. A portion of the third semiconductor pattern 1203, which overlaps the gate electrode GE3 of the third transistor T3, may be the channel area Act3 of the third transistor T3.

The gate layer 1300 may include a metal, an alloy, conductive metal oxide, a transparent conductive material, and/or the like. For example, the gate layer 1300 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, and/or the like. The gate layer 1300 may have a multilayered structure, for example, a two-layer structure including Ti/Cu, and the layer structure and materials included therein may vary.

The first interlayer insulating layer 115 may be arranged over the substrate 100 to cover the gate layer 1300. In an embodiment, the first interlayer insulating layer 115 may include SiON. The first interlayer insulating layer 115 may prevent or decrease the penetration of impurities from the outside of the display apparatus in a direction (e.g., a −z direction) towards an upper surface of the substrate 100.

When the gate insulating layer 113 is patterned to correspond to components of the gate layer 1300, the first interlayer insulating layer 115 may directly contact (e.g., physically contact) the semiconductor layer 1200 that does not overlap the gate layer 1300. In a process of forming the first interlayer insulating layer 115, some portions of the semiconductor layer 1200 may be doped with hydrogen (H), etc. and thus may function identically and/or similarly to a line or an electrode. For example, the process of forming the first interlayer insulating layer 115 may include a plasma treatment using an H-based gas, a fluorine (F)-based gas, and/or a combination thereof, or other processes, wherein the plasma treatment is performed on the exposed portion of the semiconductor layer 1200. Also, because of heat applied during a process performed after the process of forming the first interlayer insulating layer 115, for example, an annealing process, the first interlayer insulating layer 115 may provide H, etc. to the semiconductor layer 1200 contacting the first interlayer insulating layer 115. In this case, portions of the semiconductor layer 1200 that are covered by the gate layer 1300 and the gate insulating layer 113 may not be doped and thus may function as the channel areas Act1 to Act3.

A connection electrode layer 1400 may be on the first interlayer insulating layer 115. The connection electrode layer 1400 may include the first connection electrode 1401 overlapping the first capacitor electrode 1101, a second connection electrode 1402 overlapping the second gate pattern 1302, and a second sensing line ISL2 extending in the first direction (e.g., they direction).

The second sensing line ISL2 may be electrically connected to the first sensing line ISL1 through a contact hole and to an end portion of the third semiconductor pattern 1203 through the contact hole.

The first connection electrode 1401 may overlap the first capacitor electrode 1101 and the first gate pattern 1301. On a plane, the first connection electrode 1401 may entirely cover the channel area Act1 of the first transistor T1. In other words, the first connection electrode 1401 may cover most of the first gate pattern 1301 to prevent or decrease the diffusion of impurities from an upper portion of the first connection electrode 1401 towards the channel area Act1 of the first transistor T1. The first connection electrode 1401 may form the first gate pattern 1301 and the storage capacitor Cst. For example, the first gate pattern 1301 may function as a lower capacitor electrode, and the first connection electrode 1401 may function as the upper capacitor electrode of the storage capacitor Cst.

The first connection electrode 1401 may be in an opening in the first gate pattern 1301 and have a first contact portion CNT1 contacting (e.g., physically contacting) the first semiconductor pattern 1201. The first contact portion CNT1 may be provided in plural, and FIG. 5 shows that the first connection electrode 1401 includes three first contact portions CNT1.

The first contact portions CNT1 may contact (e.g., physically contact) the first semiconductor pattern 1201 through a first hole 115H penetrating the first interlayer insulating layer 115. The first hole 115H defining the first contact portion CNT1 may be spaced apart from an end portion of the gate electrode GE1 of the first transistor T1 by a first distance d1. In this case, the first distance d1 may be equal to or greater than about 10 μm. In some embodiments, the first distance d1 may be about 12 μm.

The first connection electrode 1401 may have a node line NL extending towards the third semiconductor pattern 1203. The first connection electrode 1401 may electrically connect a terminal on one side of the third transistor T3 to the second node N2 (see FIG. 4) through the node line NL.

The second connection electrode 1402 may overlap the driving power line PL and the second gate pattern 1302. The second connection electrode 1402 may contact (e.g., physically contact) one side of the first semiconductor pattern 1201 through a contact hole and may be configured to provide a driving voltage ELVDD to a terminal on one side of the first transistor T1.

The connection electrode layer 1400 may include a metal, an alloy, conductive metal oxide, a transparent conductive material, and/or the like. For example, the connection electrode layer 1400 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, and/or the like. The connection electrode layer 1400 may have a multilayered structure, for example, a three-layer structure including Ti/Cu/ITO.

A second interlayer insulating layer 117 may be on the first interlayer insulating layer 115 to cover the connection electrode layer 1400. The second interlayer insulating layer 117 may include a first inorganic insulating material of which a hydrogen concentration in a thin film is equal to or greater than about $2.0 \times 10^{22}$ atoms/cm$^3$. For example, the first inorganic insulating material may be SiN$_x$.

Because of high density, the second interlayer insulating layer 117 may prevent or reduce penetration of impurities, such as moisture, from the outside of the display apparatus in the direction (e.g., the −z direction) towards the upper surface of the substrate 100. However, because the second interlayer insulating layer 117 has a relatively high hydrogen concentration, when hydrogen ions in the second interlayer insulating layer 117 diffuse to the first semiconductor pattern 1201, electrical characteristics of the first transistor T1 may change, and thus, the degradation in display quality, such as stains on images displayed by a display apparatus, may occur. As described above, the first connection electrode 1401 may be arranged between the first interlayer insulating layer 115 and the second interlayer insulating layer 117, and thus, the diffusion of hydrogen from the second interlayer insulating layer 117 to the channel area Act1 of the first transistor T1 may be prevented or reduced. However, because of a low step coverage of a material forming the first connection electrode 1401, a penetration path of impurities, for example, cracks and/or seams, may be generated in the first contact portion CNT1 having a great step difference. According to one or more embodiments, as the first contact portion CNT1 is spaced apart from the end portion of the gate electrode GE1 of the first transistor T1 by the first distance d1, characteristics of the first transistor T1 may be improved, and high-quality images with no stains may be displayed.

In the channel area Act1 of the first transistor T1, a hydrogen intensity in an interface between the gate insulating layer 113 and the first semiconductor pattern 1201 may be equal to or less than about $1.0 \times 10^3$ counts/sec, the hydrogen intensity being measured using a Secondary Ion Mass Spectrometer (SIMS). As described, the hydrogen intensity in an interface between the gate electrode GE1 of the first transistor T1 and the gate insulating layer 113, which is measured using the SIMS, may be equal to or less than about $1.0 \times 10^3$ counts/sec.

Figure 7:
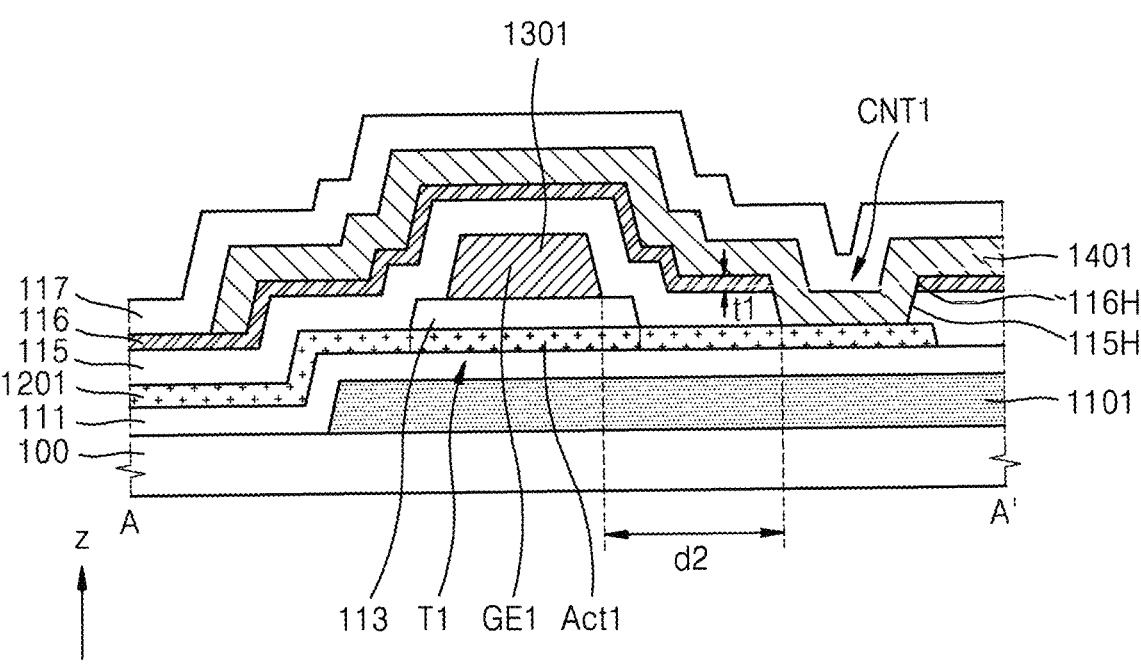
FIG. 7 is a schematic cross-sectional view of a display apparatus according to an embodiment.

FIG. 7 is a schematic cross-sectional view of a display apparatus according to an embodiment. The embodiment of FIG. 7 is similar to that of FIG. 6, but is different therefrom in that a third interlayer insulating layer 116 is further shown in FIG. 7 between the first interlayer insulating layer 115 and the first connection electrode 1401. Hereinafter, descriptions regarding the components that are the same as or similar to those provided with reference to FIG. 6 are not repeated, and a difference between the embodiments of FIGS. 6 and 7 are mainly described.

Referring to FIG. 7, the third interlayer insulating layer 116 may be arranged between the first interlayer insulating layer 115 and the first connection electrode 1401. The third interlayer insulating layer 116 may include a second inorganic insulating material of which a hydrogen intensity is less than or equal to about $1.5 \times 10^{22}$ counts/sec and/or hydrogen emissions are less than or equal to about $1.0 \times 10^{16}$ molecules/cm$^2$. Here, the hydrogen intensity is measured by the SIMS, and the hydrogen emissions are measured by a Thermal Desorption Spectrometer (TDS).

For example, the second inorganic insulating material may be SiO$_x$ of which a hydrogen intensity is between about $5.0 \times 10^{20}$ counts/sec and about $1.0 \times 10^{21}$ counts/sec and/or hydrogen emissions are between about $5.0 \times 10^{14}$ molecules/cm$^2$ and about $1.0 \times 10^{15}$ molecules/cm$^2$. In some embodiments, the second inorganic insulating material may be SiN$_x$ of which a hydrogen intensity is between about $5.0 \times 10^{21}$ counts/sec and about $1.5 \times 10^{22}$ counts/sec and/or hydrogen emissions are between about $1.0 \times 10^{15}$ molecules/cm$^2$ and about $5.0 \times 10^{16}$ molecules/cm$^2$. When roughness is measured by an Atomic Force Microscope (AFM), an upper surface of the third interlayer insulating layer 116 may have a roughness of less than 1 nm.

As a thickness of the third interlayer insulating layer 116 increases, the content of hydrogen that may diffuse to the semiconductor layer 1200 may linearly increase. Therefore, to maintain operation characteristics of the first transistor T1, a thickness t1 of the third interlayer insulating layer 116 may be between about 10 nm and about 40 nm. In an embodiment, the thickness t1 of the third interlayer insulating layer 116 may be about 20 nm.

The first contact portion CNT1 of the first connection electrode 1401 may contact (e.g., physically contact) the semiconductor layer 1200 through the first hole 115H penetrating the first interlayer insulating layer 115 and a second hole 116H penetrating the third interlayer insulating layer 116. The first hole 115H and the second hole 116H defining the first contact portion CNT1 may be spaced from an end portion of the channel area Act1 of the first transistor T1 by a second distance d2. In this case, the second distance d2 may be equal to or greater than about 7 μm. In some embodiments, the second distance d2 may be about 12 μm.

The second interlayer insulating layer 117 may be arranged over the first interlayer insulating layer 115 to cover the connection electrode layer 1400. The second interlayer insulating layer 117 may include a first inorganic insulating material of which a hydrogen concentration in a thin film is equal to or greater than about $2.0 \times 10^{22}$ atoms/cm$^3$. For example, the first inorganic insulating material may be SiN$_x$.

Because the third interlayer insulating layer 116 has a higher density than the first interlayer insulating layer 115, the diffusion of impurities, such as hydrogen ions and/or moisture, to the semiconductor layer 1200 from the outside of the display apparatus or the second interlayer insulating layer 117 through cracks and/or seams in the first connection electrode 1401 may be prevented or reduced. In this case, the hydrogen intensity of the third interlayer insulating layer 116 includes the second inorganic insulating material, of which a hydrogen intensity is less than or equal to about $1.5 \times 10^{22}$ counts/sec and/or hydrogen emissions are less than or equal to about $1.0 \times 10^{16}$ molecules/cm², and thus, a change in the electrical characteristics of the first transistor T1 because of the diffusion of the hydrogen ions in the third interlayer insulating layer 116 may be prevented or reduced.

Figure 8A:
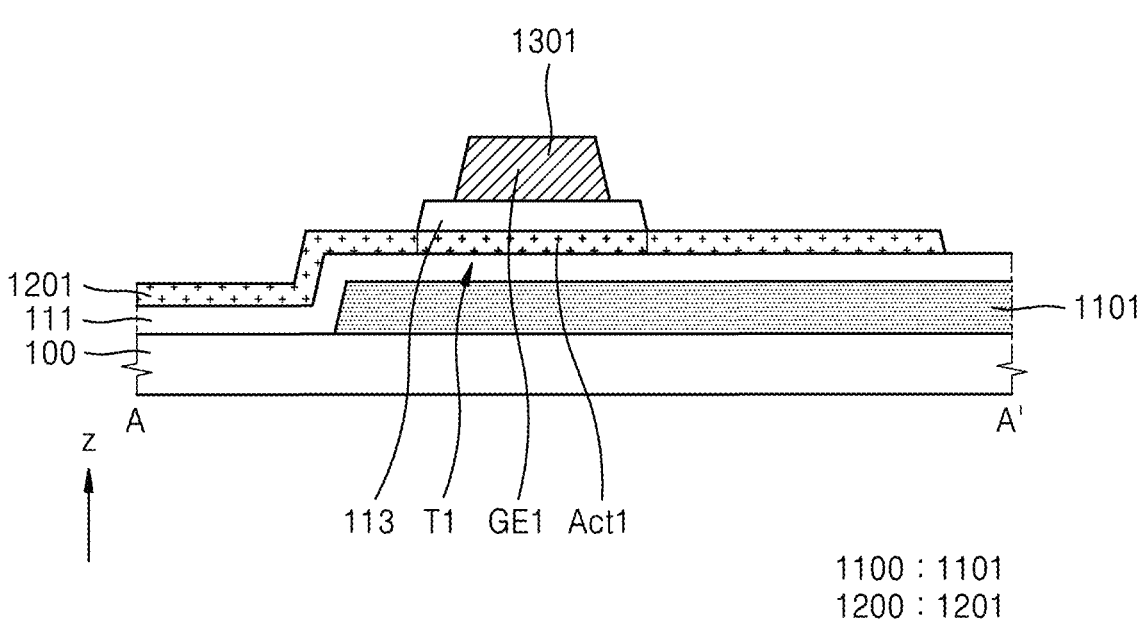
FIGS. 8A to 8C are cross-sectional views sequentially showing part of a method of manufacturing a display apparatus, according to an embodiment.
Figure 8B:
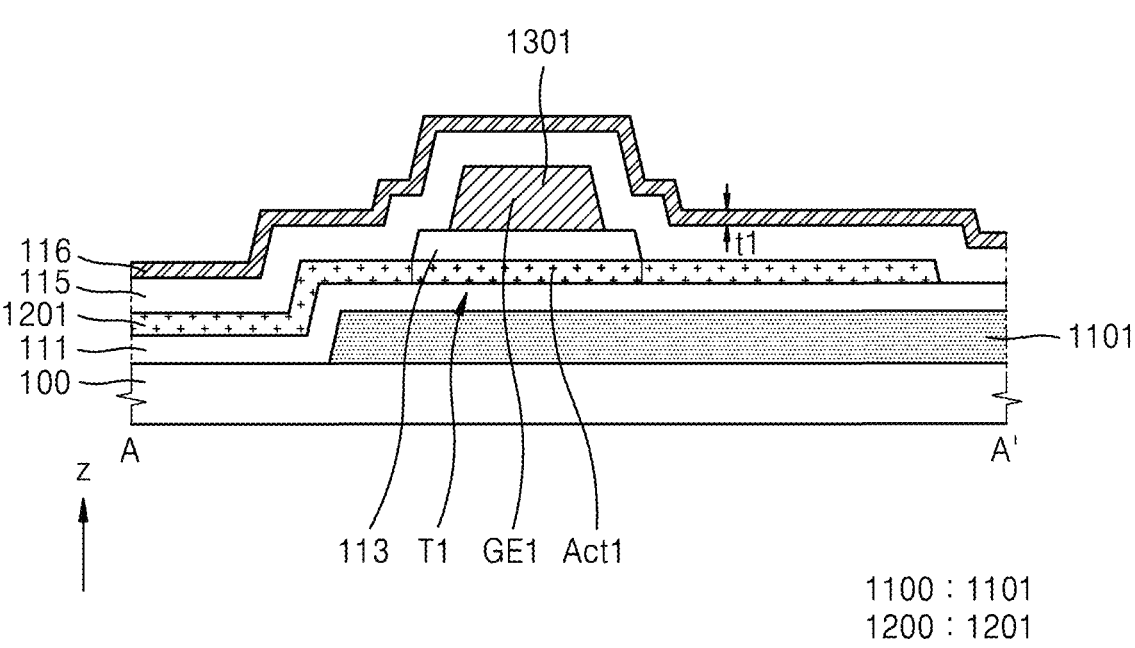
Figure 8C:
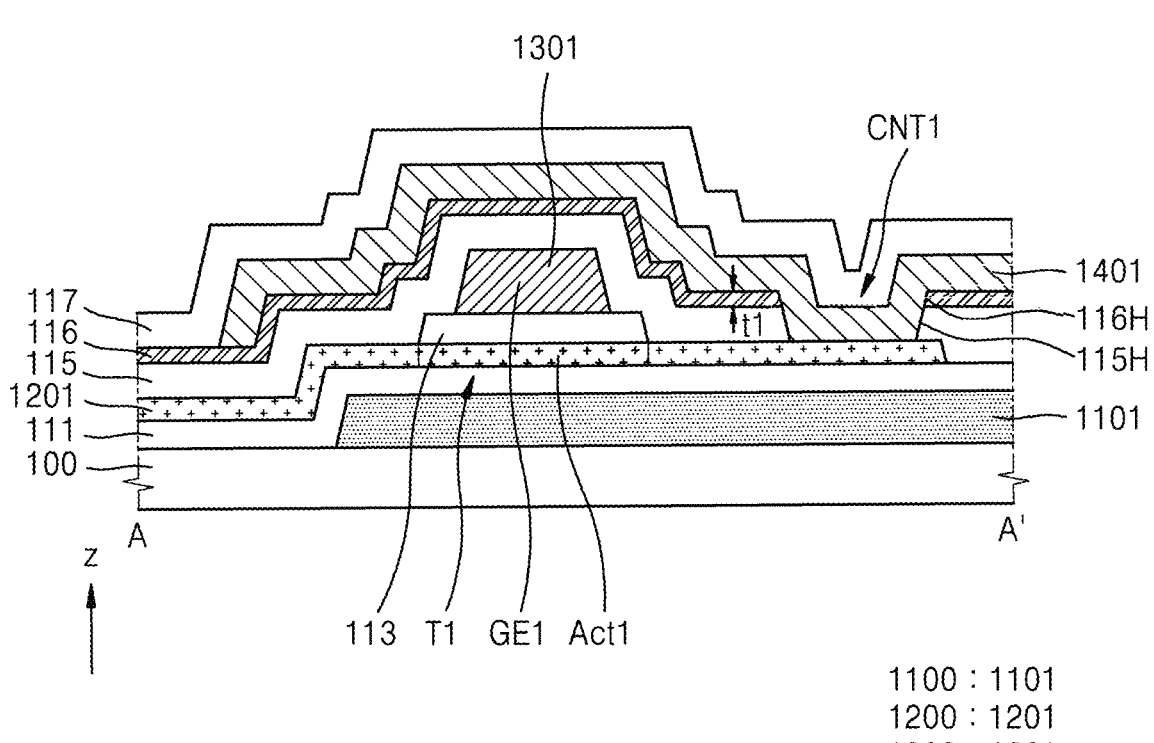

FIGS. 8A to 8C are cross-sectional views sequentially showing part of a method of manufacturing a display apparatus, according to an embodiment.

Referring to FIGS. 8A to 8C, as shown in FIG. 8A first, the lower metal layer 1100 is formed on the substrate 100, and the buffer layer 111 is formed on the lower metal layer 1100.

In more detail, a process of forming the lower metal layer 1100 may include a process of forming a first conductive layer on the substrate 100 and forming the first sensing line ISL1 (see FIG. 5), the driving power line PL (see FIG. 5), the data line DL (see FIG. 5), and the first capacitor electrode 1101 by patterning the first conductive layer.

The buffer layer 111 is entirely formed on the substrate 100. The buffer layer 111 may cover the lower metal layer 1100.

As shown in FIG. 8B, after the first semiconductor pattern 1201 and the gate electrode GE1 are formed on the buffer layer 111, the first interlayer insulating layer 115 and the third interlayer insulating layer 116 may be sequentially formed.

In more detail, processes of forming a semiconductor material layer on the buffer layer 111 and patterning the semiconductor material layer into the semiconductor layer 1200 including the first semiconductor pattern 1201, the second semiconductor pattern 1202, and the third semiconductor pattern 1203 may be included.

Then, a gate insulating material layer may be formed to cover the semiconductor layer 1200, and a second conductive layer may be formed on the gate insulating material layer. The second conductive layer may be patterned into the gate layer 1300, and the gate insulating material layer may be patterned into the gate insulating layer 113. The gate layer 1300 may include the first gate pattern 1301, the second gate pattern 1302, the control line GCL (see FIG. 5), and the scan line SL (see FIG. 5). The gate insulating material layer and the second conductive layer may be patterned in the same pattern.

The gate insulating material layer and the second conductive layer may be patterned by using different etching methods. For example, the second conductive layer may be patterned by using a dry etching method, and the gate insulating material layer may be patterned by using a wet etching method. In this case, as shown in the drawings, the gate layer 1300 may overlap the gate insulating layer 113, and a portion of the gate insulating layer 113 may be exposed to an outer side of the gate layer 1300.

The first interlayer insulating layer 115 is entirely formed on the substrate 100 to cover the gate layer 1300. The first interlayer insulating layer 115 may include SiON. As described above, while the first interlayer insulating layer 115 is formed, the semiconductor layer 1200, which is exposed by the gate layer 1300 and the gate insulating layer 113, may be doped with impurities and/or otherwise made to be conductive (e.g., electrically conductive).

The third interlayer insulating layer 116 is formed on the first interlayer insulating layer 115. The third interlayer insulating layer 116 may include the second inorganic insulating material of which the hydrogen intensity is less than or equal to about $1.5 \times 10^{22}$ counts/sec and/or the hydrogen emissions are less than or equal to about $1.0 \times 10^{16}$ molecules/cm².

For example, the third interlayer insulating layer 116 may be formed according to Chemical Vapor Deposition (CVD) and include $SiN_x$ that is formed in a low-hydrogen environment by replacing an ammonia ($NH_3$) gas entirely or partially with a nitrogen ($N_2$) gas. In this case, a hydrogen intensity of $SiN_x$ formed in the low-hydrogen environment may be between about $5.0 \times 10^{21}$ counts/sec and about $1.5 \times 10^{22}$ counts/sec. In some embodiments, hydrogen emissions of $SiN_x$ formed in the low-hydrogen environment may be between about $1.0 \times 10^{15}$ molecules/cm² and about 16 molecules/cm².

In some embodiments, the third interlayer insulating layer 116 may be formed according to CVD and include $SiO_x$ formed under high-deposition energy conditions. For example, the third interlayer insulating layer 116 may include $SiO_x$ formed in an environment in which deposition power ranges from about 4 kW to about 8 kW. In this case, a hydrogen intensity of $SiO_x$ formed under the high-deposition energy conditions may be between about $5.0 \times 10^{20}$ counts/sec and about $1.0 \times 10^{21}$ counts/sec. In some embodiments, hydrogen emissions of $SiO_x$ formed under the high-deposition energy conditions may be between about $5.0 \times 10^{14}$ molecules/cm² and about $1.0 \times 10^{15}$ molecules/cm².

The thickness t1 of the third interlayer insulating layer 116 may be between about 10 nm and about 40 nm. In some embodiments, the thickness t1 of the third interlayer insulating layer 116 may be about 20 nm.

As shown in FIG. 8C, the connection electrode layer 1400 may be formed on the third interlayer insulating layer 116, and the second interlayer insulating layer 117 may be formed on the connection electrode layer 1400 in sequence.

First of all, the second hole 116H penetrating the third interlayer insulating layer 116 and the first hole 115H penetrating the first interlayer insulating layer 115 may be formed. The first hole 115H may overlap the second hole 116H, and thus, a portion of an upper surface of the semiconductor layer 1200 may be exposed from the first interlayer insulating layer 115 and the third interlayer insulating layer 116.

A third conductive layer may be formed on the third interlayer insulating layer 116 and then patterned into the connection electrode layer 1400. The connection electrode layer 1400 may overlap the first transistor T1 and include the first connection electrode 1401, the second connection electrode 1402, and the second sensing line ISL2 that contact (e.g., physically contact) the semiconductor layer 1200 through the first hole 115H and the second hole 116H.

The second interlayer insulating layer 117 may be formed on the connection electrode layer 1400. The second interlayer insulating layer 117 may include the first inorganic insulating material of which a hydrogen concentration in a thin film is equal to or greater than about $2.0 \times 10^{22}$ atoms/cm³. For example, the first inorganic insulating material may be $SiN_x$ formed according to CVD. In this case, the hydrogen intensity of $SiN_x$ included in the second interlayer insulating layer 117 may be between about $2.0 \times 10^{22}$ counts/sec and about $3.0 \times 10^{22}$ counts/sec. In some embodiments, the hydrogen emissions of $SiN_x$ included in the second interlayer insulating layer 117 may be between about $2.0 \times 10^{16}$ molecules/cm² and about $3.0 \times 10^{16}$ molecules/cm².

In some embodiments, the light-emitting diode layer 300 (see FIG. 2) and the encapsulation layer 400 (see FIG. 2) may be sequentially formed on the second interlayer insulating layer 117.

Figure 9:
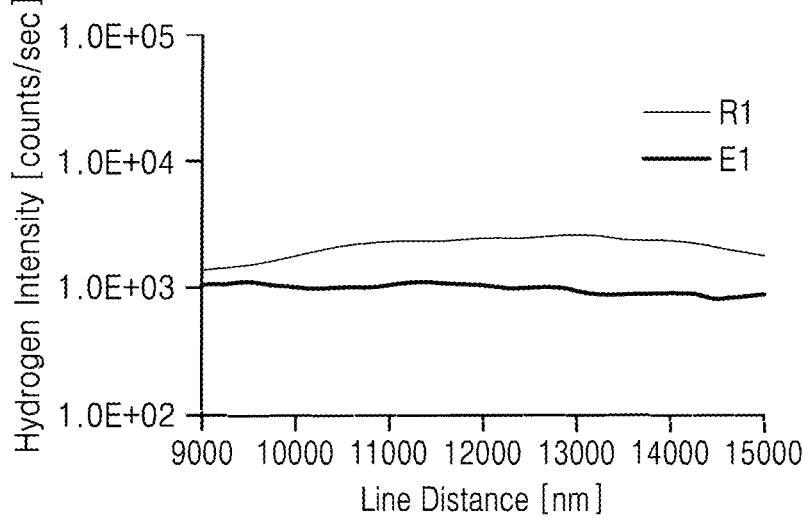
FIGS. 9 and 10 are graphs showing hydrogen intensities of Experimental Example E1 and Comparative Example R1 measured using a Secondary Ion Mass Spectrometer (SIMS)
Figure 10:
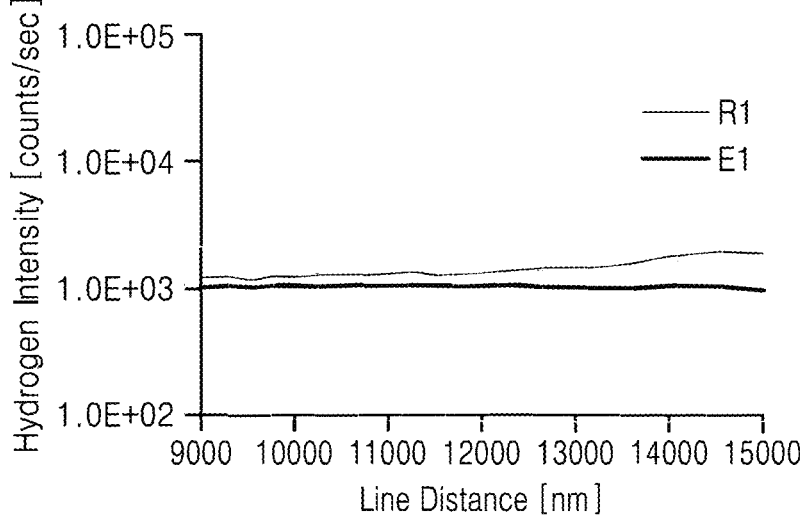

FIGS. 9 and 10 are graphs showing hydrogen intensities of Experimental Example E1 and Comparative Example R1 that are measured using a SIMS. FIG. 9 is a graph showing a hydrogen intensity in an interface between the gate electrode GE1 and the gate insulating layer 113 along line B of the display apparatus of FIG. 6. FIG. 10 is a graph showing a hydrogen intensity in an interface between the gate insulating layer 113 and the channel area Act1 of the first transistor T1 along line C of the display apparatus of FIG. 6.

As shown in FIG. 6, in Experimental Example E1, the first interlayer insulating layer 115, the first connection electrode 1401, and the second interlayer insulating layer 117 are sequentially stacked on the gate electrode GE1 of the first transistor T1. The gate insulating layer 113 may be an $SiO_x$ thin film, and the first interlayer insulating layer 115 may be an SiON thin film having a thickness of about 30 nm. The first contact portion CNT1 may be spaced apart from an end portion of the gate electrode GE1 of the first transistor T1 by as much as about 12 μm.

The structure in Comparative Example R1 is similar to that in Experimental Example E1, but a first contact portion is spaced apart from an end portion of the gate electrode GE1 of the first transistor T1 by as much as about 7 μm.

Referring to FIG. 9, it was confirmed that the hydrogen intensity in the interface between a gate electrode and a gate insulating layer was greater than about $1.0 \times 10^3$ counts/sec in an area corresponding to line B of Comparative Example R1, but relatively uniform at about $1.0 \times 10^3$ counts/sec in the entire area corresponding to line B of Experimental Example E1.

That is, in the case of Experimental Example E1 manufactured according to an embodiment, it was identified that the hydrogen diffusion to the interface between the gate electrode and the gate insulating layer was reduced.

Referring to FIG. 10, it was identified that a hydrogen intensity in an interface between a channel area and a gate insulating layer was greater than about $1.0 \times 10^3$ counts/sec in an area corresponding to line C of Comparative Example R1, and the hydrogen intensity linearly increased in a section of about 3 μm from a point of about 12,000 nm to about a point of about 15,000 nm that is close to the first contact portion.

That is, because of the hydrogen diffusion through an impurity diffusion path, such as cracks and/or seams, in the first contact portion from the first contact portion to a point of about 10 μm, the hydrogen intensity in the interface between the channel area and the gate insulating layer may increase.

On the contrary, in an area corresponding to line C of Experimental Example E1, it was found that the hydrogen intensity was relatively uniform at about $1.0 \times 10^3$ counts/sec. That is, when a distance from the first contact portion to the end portion of the gate electrode is about 12 μm, the hydrogen diffusion to the interface between the channel area and the gate insulating layer may decrease.

Figure 11:
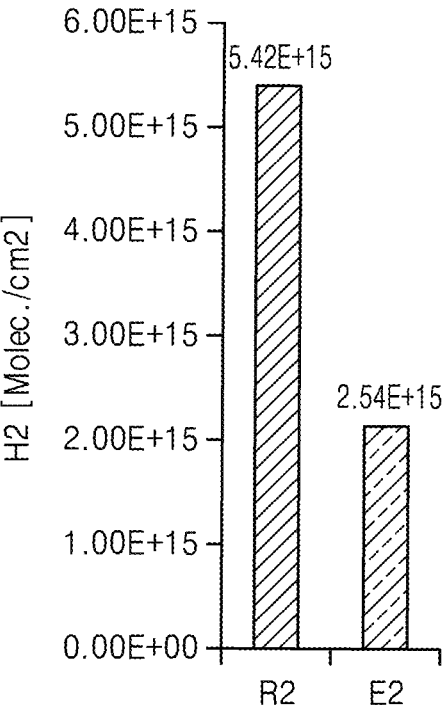
FIG. 11 is a graph showing hydrogen emissions of Experimental Example E1 and Comparative Example R1 measured using a Thermal Desorption Spectrometer (TDS)

FIG. 11 is a graph showing hydrogen emissions of an insulating layer according to Experimental Example E2 and Comparative Example R2 that are measured using a TDS.

Experimental Example E2 of FIG. 11 is a single $SiN_x$ layer formed according to CVD and in a low-hydrogen environment in which an $NH_3$ gas is not used and a $N_2$ gas is used instead. Experimental Example E2 was formed according to deposition power of about 4.3 kW in an atmosphere in which a $SiH_4$ is about 1,000 sccm and a $N_2$ gas is about 49,000 sccm. Comparative Example R2 is a single $SiN_x$ layer formed in a general environment using an $NH_3$ gas. Comparative Example R2 was formed according to deposition power of about 4.3 kW in an atmosphere in which a $SiH_4$ gas is about 1,000 sccm, a $N_2$ gas is about 49,000 sccm, and an $NH_3$ gas is about 6,600 sccm.

Referring to FIG. 11, the hydrogen emissions of Comparative Example R2 are about $5.42 \times 10^{15}$ molecule/cm$^2$, and the hydrogen emissions of Experimental Example E2 are about $2.54 \times 10^{15}$ molecule/cm$^2$; thus, it was identified that the hydrogen in the single $SiN_x$ layer of Experimental Example E2 formed in the low-hydrogen environment was half the hydrogen in Comparative Example R2 or less.

Figure 12:
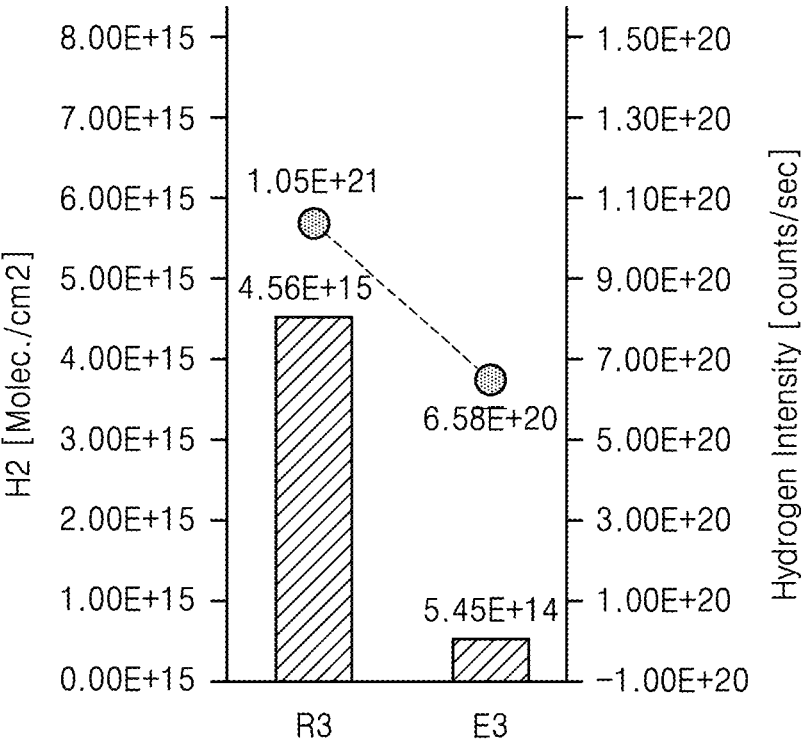
FIG. 12 is a graph showing hydrogen emissions and hydrogen intensities of Experimental Example E3 and Comparative Example R3 measured using a TDS and a SIMS.

FIG. 12 is a graph showing hydrogen emissions and hydrogen intensities of an insulating layer according to Experimental Example E3 and Comparative Example R3 that are measured using a TDS and a SIMS.

Experimental Example E3 is formed according to CVD and a single $SiO_x$ layer formed in an environment in which deposition power is about 6 kW. Comparative Example R3 is a single $SiO_x$ layer formed in a general energy condition in which deposition power is about 2 kW.

Referring to FIG. 12, hydrogen emissions of Experimental Example E3 formed under a high-deposition energy condition are about $5.45 \times 10^{14}$ molecules/cm$^2$, which is found to be only 11% of the hydrogen emissions of Comparative Example R3 that are about $4.56 \times 10^{15}$ molecules/cm$^2$. A hydrogen intensity of Experimental Example E3 is about $6.58 \times 10^{20}$ counts/sec, and it was identified that the hydrogen intensity was reduced to about 62% of a hydrogen intensity of Experimental Example E3.

As described above, a third interlayer insulating layer has a high density, low hydrogen emissions, and a low hydrogen concentration. Therefore, the diffusion of hydrogen, etc. to a semiconductor layer through an impurity penetration path, such as cracks and/or seams, in a first connection electrode may be effectively prevented or reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
    a thin film transistor comprising a semiconductor pattern comprising an oxide semiconductor and a gate electrode overlapping the semiconductor pattern;
    a first interlayer insulating layer on the semiconductor pattern and the gate electrode;
    a connection electrode on the first interlayer insulating layer and contacting the semiconductor pattern through a contact hole penetrating the first interlayer insulating layer; and
    a second interlayer insulating layer on the connection electrode,
    wherein a hydrogen concentration of the second interlayer insulating layer is greater than a hydrogen concentration of the first interlayer insulating layer,
    wherein the connection electrode entirely covers the gate electrode in a plan view, and an end portion of the gate electrode is spaced apart from the contact hole by a first distance.

2. The display apparatus of claim 1, wherein the first distance is equal to or greater than about 10 μm.

3. The display apparatus of claim 1, wherein the hydrogen concentration of the second interlayer insulating layer is equal to or greater than about $2.0 \times 10^{22}$ atoms/cm$^3$, and in an area where the gate electrode overlaps the semiconductor pattern, a hydrogen intensity in an interface of the semiconductor pattern is less than or equal to about $1.0 \times 10^3$ counts/sec.

4. The display apparatus of claim 1, wherein the first interlayer insulating layer comprises silicon oxynitride (SiON), and the second interlayer insulating layer comprises silicon nitride (SiN$_x$).

5. A display apparatus comprising:

a thin film transistor comprising a semiconductor pattern comprising an oxide semiconductor and a gate electrode overlapping the semiconductor pattern;

a first interlayer insulating layer on the semiconductor pattern and the gate electrode;

a third interlayer insulating layer on the first interlayer insulating layer and having a higher density than the first interlayer insulating layer; and a connection electrode contacting the semiconductor pattern through a contact hole penetrating the first interlayer insulating layer and the third interlayer insulating layer, wherein the connection electrode entirely covers the gate electrode in a plan view.

6. The display apparatus of claim 5, wherein the third interlayer insulating layer comprises a silicon nitride (SiN$_x$) layer of which a hydrogen intensity is between about $5.0 \times 10^{21}$ counts/sec and about $1.5 \times 10^{22}$ counts/sec.

7. The display apparatus of claim 5, wherein the third interlayer insulating layer comprises a silicon nitride (SiN$_x$) layer of which hydrogen emissions are between about $1.0 \times 10^{15}$ molecules/cm$^2$ and about $5.0 \times 10^{16}$ molecules/cm$^2$.

8. The display apparatus of claim 5, wherein the third interlayer insulating layer comprises a silicon oxide (SiO$_x$) layer of which a hydrogen intensity is between about $5.0 \times 10^{20}$ counts/sec and about $1.0 \times 10^{21}$ counts/sec.

9. The display apparatus of claim 5, wherein the third interlayer insulating layer comprises a silicon oxide (SiO$_x$) layer of which hydrogen emissions are between about $5.0 \times 10^{14}$ molecules/cm$^2$ and about $1.0 \times 10^{15}$ molecules/cm$^2$.

10. The display apparatus of claim 5, wherein a thickness of the third interlayer insulating layer is between about 10 nm and about 40 nm.

11. A method of manufacturing a display apparatus, the method comprising:

forming, on a substrate, a lower metal layer and a buffer layer covering the lower metal layer;

forming, on the buffer layer, a semiconductor pattern, a gate electrode, and a first interlayer insulating layer covering the gate electrode;

forming a connection electrode on the first interlayer insulating layer, contacting the semiconductor pattern through a contact hole penetrating the first interlayer insulating layer, and entirely covering the gate electrode on a plane; and forming a second interlayer insulating layer covering the connection electrode, wherein a hydrogen concentration of the second interlayer insulating layer is higher than a hydrogen concentration of the first interlayer insulating layer.

12. The method of claim 11, wherein, in the forming of the connection electrode, the contact hole is spaced apart from an end portion of the gate electrode by a first distance, and the first distance is equal to or greater than about 10 μm.

13. The method of claim 11, wherein the first interlayer insulating layer comprises silicon oxynitride (SiON), and the second interlayer insulating layer comprises silicon nitride (SiN$_x$).

14. The method of claim 11, further comprising forming a third interlayer insulating layer on the first interlayer insulating layer, the forming being performed between the forming of the first interlayer insulating layer and the forming of the connection electrode, wherein a hydrogen intensity of the third interlayer insulating layer is less than or equal to about $1.5 \times 10^{22}$ counts/sec and/or hydrogen emissions thereof are less than or equal to about $1.0 \times 10^{16}$ molecules/cm$^2$.

15. The method of claim 14, wherein, in the forming of the third interlayer insulating layer, the third interlayer insulating layer comprises a SiN$_x$ layer and is formed in a silane (SiH$_4$) gas and nitrogen (N$_2$) gas atmosphere.

16. The method of claim 14, wherein, in the forming of the third interlayer insulating layer, the third interlayer insulating layer comprises a SiO$_x$ layer and is formed at a deposition power in a range from about 4 KW to about 8 kW.

17. The method of claim 14, wherein a thickness of the third interlayer insulating layer is between about 10 nm and about 40 nm.

18. The method of claim 14, wherein a hydrogen concentration of the second interlayer insulating layer is equal to or greater than about $2.0 \times 10^{22}$ atoms/cm$^3$, and in an area where the gate electrode overlaps the semiconductor pattern, a hydrogen intensity in an interface of the semiconductor pattern is less than or equal to about $1.0 \times 10^3$ counts/sec.

* * * * *